US005717160A

United States Patent [19]
Bootle

[11] Patent Number: 5,717,160
[45] Date of Patent: Feb. 10, 1998

[54] ELECTROMAGNETIC SHIELDING ENCLOSURE FOR ELECTRONIC COMPONENTS

[75] Inventor: John David Bootle, Bennington, Vt.

[73] Assignee: Vermont Composites, Inc., Bennington, Vt.

[21] Appl. No.: 286,271

[22] Filed: Aug. 5, 1994

[51] Int. Cl.$^6$ ................................................ H05K 9/00
[52] U.S. Cl. ........................... 174/35 R; 174/51; 361/818
[58] Field of Search ..................... 174/35 R, 174 MS, 174/51; 361/816, 818; 439/607, 608, 609, 610

[56] References Cited

U.S. PATENT DOCUMENTS

| | | | |
|---|---|---|---|
| 3,707,120 | 12/1972 | Schroeder | 161/90 |
| 4,514,586 | 4/1985 | Waggoner | 174/35 MS |
| 4,587,161 | 5/1986 | Barrell et al. | 428/288 |
| 4,973,514 | 11/1990 | Gamble et al. | 428/297 |
| 5,137,766 | 8/1992 | Mazanek et al. | 428/68 |
| 5,171,161 | 12/1992 | Kachlic | 439/352 |
| 5,330,360 | 7/1994 | Marsh et al. | 439/76 |
| 5,520,976 | 5/1996 | Giannetti et al. | 428/36.3 |

FOREIGN PATENT DOCUMENTS 0 399 944  11/1990  European Pat. Off. ......... H05K 9/00

*Primary Examiner*—Kristine L. Kincaid
*Assistant Examiner*—Kristina Soderquist
*Attorney, Agent, or Firm*—Oliff & Berridge

[57] ABSTRACT

An enclosure and a method of making an enclosure for electromagnetic shielding of electronic circuitry contained therein. The enclosure is a carbon fiber composite having a removable panel which is assembled to the enclosure body through mating surfaces which are in electrical contact, and an electrically conductive ground strap extends from the mating surfaces to an inlet port for a cable connector. The ground strap is grounded via the cable connector.

15 Claims, 3 Drawing Sheets

ELECTROMAGNETIC SHIELDING ENCLOSURE FOR ELECTRONIC COMPONENTS

BACKGROUND OF THE INVENTION

1. Field of the Invention

This invention relates to enclosures for electronic circuitry and in particular to enclosures which provide for electromagnetic shielding of the circuitry.

2. Description of the Related Art

Enclosures for airborne electronic circuitry are conventionally fabricated from aluminium sheet which provides for adequate shielding of the electronic components located therein. This shielding is generally known as electromagnetic interference (EMI) shielding. In order to save weight, the enclosures can be formed from fiber-reinforced composites and, in particular, composites reinforced by carbon fiber. Carbon fiber is electrically conductive and enclosures formed with carbon fiber reinforcement offer a degree of EMI shielding. EMI shielding provided by carbon fiber composite enclosures can be further enhanced by inclusion of nickel coated carbon fiber tissue into the composite.

Such an enclosure must have at least one removable lid or panel to provide access to the electronic circuitry for maintenance purposes. The joints between a lid or panel and the enclosure body tend to provide a source of radiation leakage and thus cause a reduction in shielding effectiveness. Conventionally, this reduction has been ameliorated by the use of electrically conductive compliant gasket material trapped between the lid or panel and the rest of the enclosure.

OBJECT OF THE INVENTION

The present invention provides for improved EMI shielding for composite enclosures having a removable lid or panel.

SUMMARY OF THE INVENTION

According to the present invention there is provided an enclosure for electromagnetic shielding of electronic circuitry contained therein, said enclosure being formed from a resinous composite reinforced at least in part by electrically conductive fibers and which comprises at least two parts assembled together through a set of cooperating mating surfaces which are in electrical contact, characterised in that an electrically conductive strap extends from said mating surfaces to an enclosure inlet port for contact in use with a grounded cable connector coupled with the inlet port.

Preferably, the cooperating mating surfaces of each of said two parts have a metallic layer, preferably a colamination of foil, preferably copper, laminated into the mating surfaces. The metallic layer may also be formed by thermal spraying, vapour deposition, plating, and other conductive metals, such as nickel, tin, silver, chromium, aluminum, gold, zinc and cadmium may be used singly or in combination Additionally, conductive gasket means may be used between the mating flanges. Such gasket means may comprise a wire reinforced compliant material with the wire in the form of mesh, or oriented fabrics, or elastomer-loaded with electrically conductive particles.

The strap may be laminated into the surface of the enclosure, and is preferably integrally formed with the metal layer formed on the mating surfaces.

The invention also provides a method of electromagnetically shielding electronic circuitry held within an enclosure made from a resinous composite reinforced at least in part by electrically conductive fibers and which enclosure comprises at least two parts assembled together through a set of cooperating mating surfaces which mating surfaces are in electrical contact, said method including the step of electrically connecting the mating flanges to ground.

The invention further provides a method of manufacture of an enclosure for electromagnetic shielding of electronic circuitry housed therein, wherein said enclosure is formed from at least two parts which are assembled together through mating surfaces which are in electrical contact, said at least two parts being made from resin-impregnated fiber reinforced composite containing at least in part electrically conductive fibers and at least one part being provided with an inlet port, having peripheral margins, for a cable connector, wherein a metal ground path is formed, preferably by colamination, onto a surface of said one part for electrically connecting the two mating surfaces with said peripheral margins of the inlet port.

BRIEF DESCRIPTION OF THE DRAWINGS

The invention will now be further described, by way of example, with reference to the accompanying drawings, in which.

DESCRIPTION OF PREFERRED EMBODIMENTS

Figure 1:
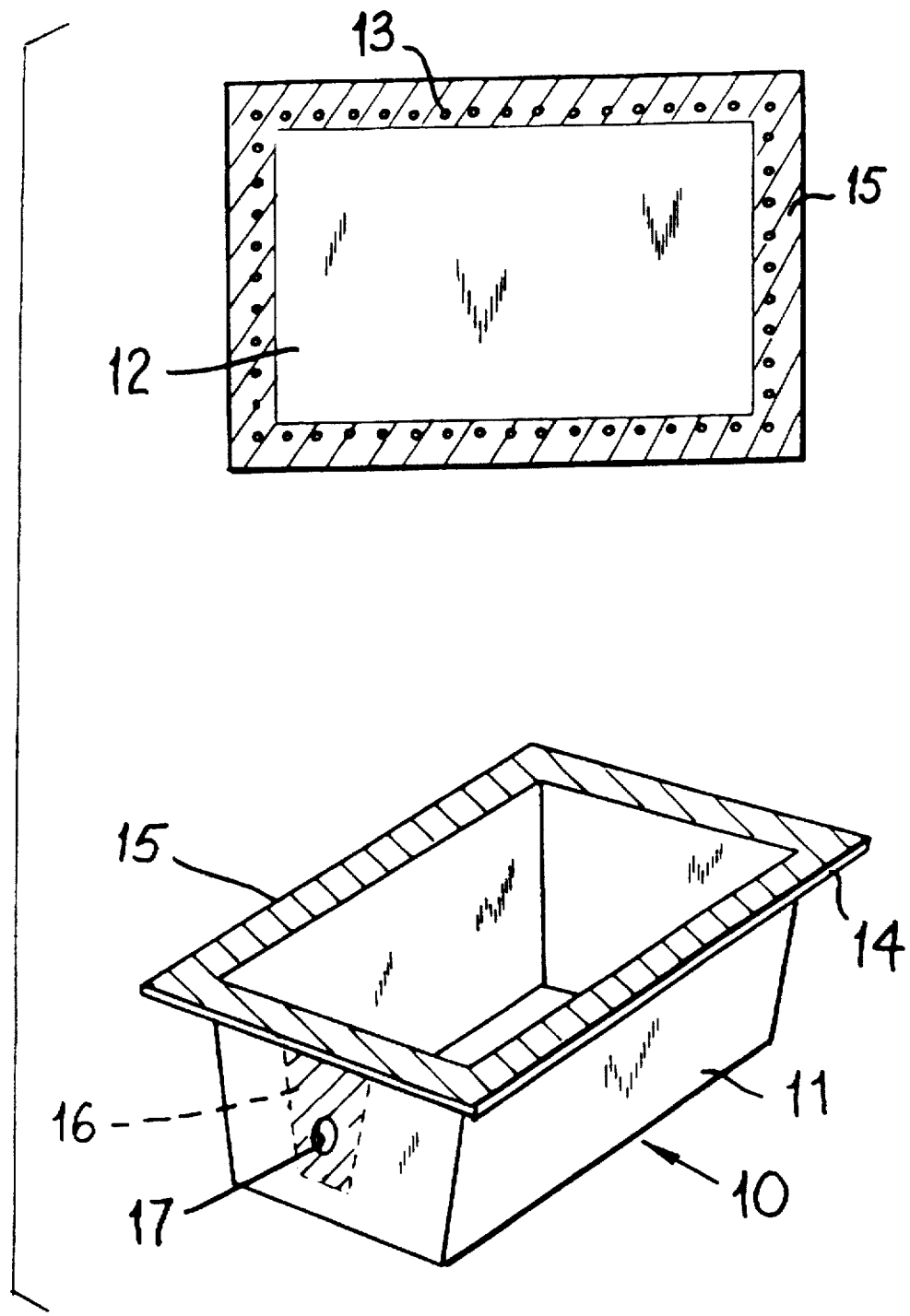
FIG. 1 shows an open-topped enclosure according to the invention and the lid to close it.

This invention relates to an enclosure 10, FIG. 1, for housing electronic circuitry, and in particular to fiber-reinforced composites and especially to composites of carbon fiber reinforced resins. Thermosetting resins such as phenolic resins, polyimides, bismaleimide, epoxy resins may be used, or thermoplastics such as polyether ketones or polyetherimides.

The enclosure 10 is a five-sided, open-topped box 11 with a removable lid 12. The box 11 at its upper edge has an external flange 14 to which the lid 12 can be secured by bolts, screws or other fasteners which pass through a plurality of aligned spaced holes 13 in the outer peripheral margins of the lid and in the flange, although holes in the flange have not yet been formed as shown in FIG. 1. An internally projecting flange 14 could equally be used if desired.

The box 11 comprises eight plies of Fiberire (Trademark) HMF 322D/7714AC pre-impregnated ("pre-preg") carbon fiber reinforced epoxy resin over the main section with ten plies used in flanges 14 and in the lid 12. The plies of pre-preg were cut using three separate templates. These templates were designed so that the layers of pre-preg would have joins in different areas of the box, such that there was some continuous fiber in all areas of the box. The overall thickness of the box wall was approximately 2 mm. The plies were laid onto a tool and copper foil 15 having a thickness of 38 μm was co-laminated around the mating surfaces on the lid 12 and flange 14; and in the form of a strap 16 on an internal surface of the container. This foil provides copper mating surfaces on the lid and box and provides a path of good electrical conductivity extending away from the mating surfaces.

After molding of the box 11 by either matched die molding techniques, or by bag-forming techniques and curing at 120° C. for 1 hour, the molded enclosure is trimmed and holes 13 are drilled into the flange 14 and around the lid 12 and a hole 17, forming an inlet port to the box, is drilled in the side wall in the area covered by the copper foil strap 16 to leave electrically conducting peripheral margins of the hole 17 inside the box 11.

Alternatively, the box can be formed by laying dry carbon fiber mat or cloth in a mold and injecting resin therein.

To create better electrical paths throughout the lid and box, the mating flanges and other surfaces can be abraded to remove surface resin and any copper oxide layer on the copper foil, and to expose the carbon fibers.

An enclosure according to the invention was tested and compared with a fabricated sheet metal aluminum enclosure of similar dimensions. The aluminum enclosure was made from 6 mm sheets folded and welded with care taken to avoid gaps at the joints. After manufacture, the enclosure and its lid were both coated on both sides with a chromate conversion coating as per MIL-C-5541 Class 3 specification.

composite surface area around the hole 17 being grounded to the connector 25 and the results were compared with a prior art aluminum enclosure which conformed with the MIL-E-85726 (AS) specification.

The worst case shielding effectiveness was measured. This was done by orientating the enclosures such that the longest joint was exposed to the antennas. The shielding effectiveness was measured by transmitting a signal and measuring the signal strength received, with and without an enclosure in place. The difference in signal strength when expressed in logarithmic values gives a measure of shielding. Shielding values were determined at spot frequencies throughout the frequency range.

Figure 3:
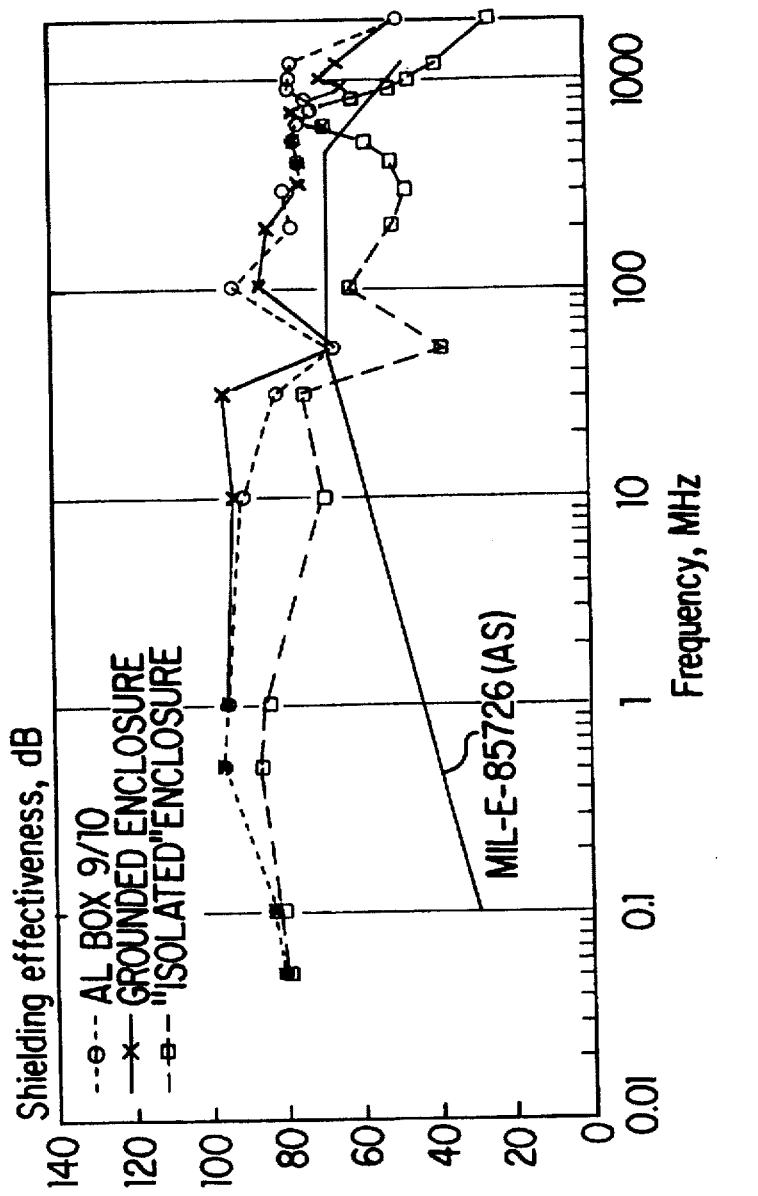
FIG. 3 is a graph showing test results for shielding effectiveness of the enclosure shown in FIG. 2.

The results of the test are shown graphically in FIG. 3 and are given in Table 1 below, with the MIL-E-85726 (AS) requirement shown in the graph as a reference. The graph plots the frequency in MHz (log scale) against the shielding effectiveness in dB.

The results are given in Table 1 below with the aluminum enclosure which conforms to MIL-E-85726 (AS), with the shielding effectiveness being measured in dB. The higher the measured dB the more effective the shielding.

TABLE 1

| | Frequency of signal in MHz | | | | | | | | | | | | | | | | | | |
|---|---|---|---|---|---|---|---|---|---|---|---|---|---|---|---|---|---|---|---|
| | 0.05 | 0.1 | 0.5 | 1 | 10 | 30 | 50 | 100 | 200 | 300 | 400 | 500 | 600 | 700 | 800 | 900 | 1000 | 1200 | 2000 |
| A: | 81 | 84 | 98 | 97 | 93 | 84 | 70 | 96 | 80 | 82 | 78 | 79 | 71 | 79 | 76 | 81 | 80 | 80 | 52 |
| B: | 81 | 84 | 98 | 97 | 96 | 99 | 68 | 89 | 86 | 78 | 78 | 80 | 70 | 80 | 75 | 46 | 73 | 68 | 52 |
| C: | 80 | 82 | 88 | 86 | 71 | 77 | 40 | 65 | 53 | 50 | 54 | 61 | 79 | 74 | 64 | 54 | 49 | 42 | 28 |

A: = readings in dB for aluminum enclosure.
B: = readings in dB for enclosure of type shown in FIG. 1 with strap 16 grounded.
C: = readings in dB for enclosure of type shown in FIG. 1 with strap 16 isolated.

Figure 2:
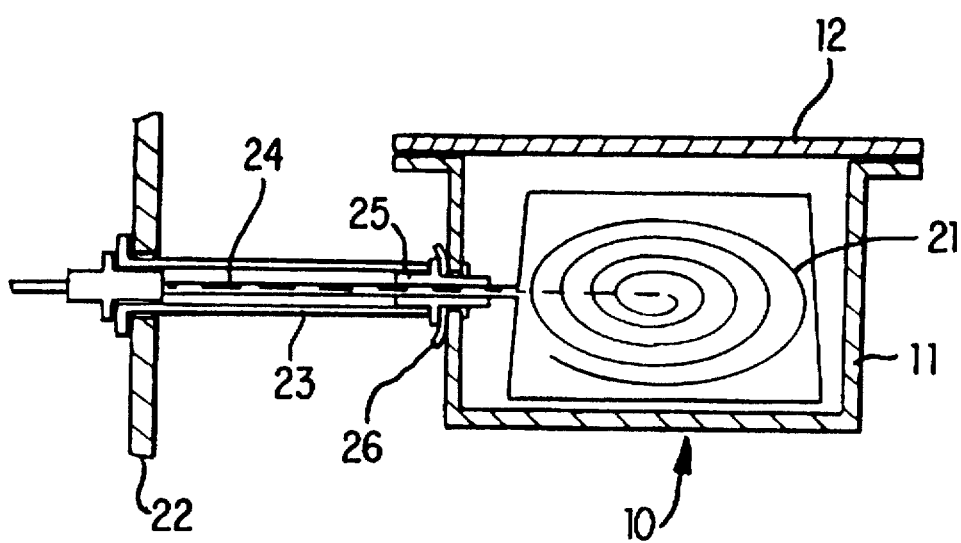
FIG. 2 is a cross-sectional schematic drawing showing how the enclosure of FIG. 1 can be tested for its electromagnetic shielding effectiveness.

The ability of the enclosures 10 to meet the electromagnetic interference shielding effectiveness specification of MIL-E-85726 (AS) was tested according to MIL-STD-285 procedures. Accordingly, as shown in FIG. 2, transmitting antenna 21 was placed inside the box 11 and the latter was closed with the lid 12. The antenna was a dual element spiral antenna, and a receiving antenna (not shown) was arranged outside the enclosure 10, both antennas being inside a shielded room represented in part by a wall 22. The enclosure 10 was tested between 50 KHz and 2 GHz and the following receiving antennas were used:

| Frequency Range | Receiving Antenna |
|---|---|
| 50 KHz to 30 MHz | a rod antenna |
| 50 MHz to 100 MHz | a biconical antenna |
| 200 MHz to 2GHz | a log spiral antenna |

A copper pipe 23 connected the enclosure 10 to the wall 22 of the shielded room thereby grounding the pipe 23. A coaxial cable 24 passed coaxially through the pipe and was connected to the transmitting antenna 21 through a hollow connector 25, preferably an N-type coaxial connector. The screening of the coaxial cable 24 was earthed to the wall 22 through the connector 25, and pipe 23 with a highly conductive gasket 216 being trapped between the connector 25 and the box 11 of the enclosure.

A composite enclosure 10 according to the invention was tested with the strap 16 grounded via the connector 25, and with the strap 16 isolated from the grounding but with the The results show some variation due to at least the following variables:

(a) Antenna and amplifier changes: three receiving antennas were used to cover the frequency range under test. The change-overs occur at 30 MHz and 200 MHz. The amplifier was also changed at 200 MHz. There is typically a very apparent drop in shielding effectiveness at 200 MHz probably due to these changes.

(b) Antenna position: it was found that if the receiving antenna was moved from its position by small distances then different shielding values were measured. It is therefore necessary to maintain the antenna in the same position as much as is possible.

(c) Other factors which may affect the results measured are room reflections, resonances and standing waves in the cable, tube, and container, and any electrical currents generated within the enclosures.

However, the test results show the effect of grounding the mating surfaces between the lid 12 and flange 14 through the strap 16 and connector 25 to the copper tube 24.

It is readily apparent that at higher frequencies the enclosure with the isolated strap 16 does not meet the MIL-E-85726 (AS) requirements, whereas the simple provision of a ground path to the strap raises the shielding effectiveness of the enclosure so that it substantially meets that requirement. Indeed, from Table 1 it can be seen that the enclosure 10 with the grounded strap 16 for most of the frequency range tested has a shielding performance which is substantially in line with that provided by the aluminium enclosure.

Alternative enclosures in accordance with the invention could be made from a composite containing metallised fabrics or metal reinforcements such as wire mesh or expanded mesh. Nickel coated carbon fibers in which at least one ply of non-woven nickel coated tissue (International paper grade 8000855, 0.3 oz/yd$^2$) is incorporated into the sides of the container and the lid can also be used with advantage.

Furthermore, the ground path strap (16) could be provided on the external surface of the enclosure if desired. If the enclosure is formed with more than one removable lid or panel, then the respective mating surfaces for each lid or panel on the container body should have a respective ground strap.

The copper foil may also be tin-coated to prevent the formation of copper oxides.

I claim:

1. The enclosure for electromagnetic shielding of electronic circuitry contained therein, said enclosure being formed from a resinous composite reinforced at least in part by electrically-conductive fibers and which comprises:

at least two parts assembled together through a set of cooperating mating surfaces which are in electrical contact; and an electrically conductive strap extending from said mating surfaces to an enclosure inlet port for contact in use with a grounded cable connector coupled with the enclosure inlet port.

2. The enclosure as claimed in claim 1, wherein the cooperating mating surfaces of each of said two parts have a metallic layer on the mating surfaces.

3. The enclosure as claimed in claim 2, wherein each metallic layer is a foil colaminated into the respective mating surface.

4. The enclosure as claimed in claim 3, wherein the foil is a copper foil.

5. The enclosure as claimed in claim 4, wherein the copper foil is tin plated.

6. The enclosure as claimed in claim 1, wherein the strap is laminated into a surface of the enclosure.

7. The enclosure as claimed in claim 2, wherein the strap is formed integrally with the metallic layer and is laminated into a surface of the enclosure.

8. The enclosure as claimed in claim 7, wherein the enclosure comprises an enclosure body part with at least one removable panel part secured to the enclosure body part through a respective set of mating flanges, the set of mating flanges being connected to the enclosure inlet port by said strap.

9. The enclosure as claimed in claim 1, wherein the electrically-conductive fiber is carbon fiber.

10. A method of electromagnetically shielding electronic circuitry held within an enclosure made from a resinous composite reinforced at least in part by electrically conductive fibers and said enclosure comprises at least two parts assembled together through a set of cooperating mating surfaces, said mating surfaces are in electrical contact, said method including the step of electrically connecting the mating surfaces to ground, wherein the mating surfaces on the enclosure are connected to ground through a strap extending from the mating surfaces to a cable inlet port formed in the enclosure for contact with a grounded cable connector entering the cable inlet port.

11. The method as claimed in claim 10, wherein the mating surfaces are formed with metal foil laminated into each of the mating surfaces.

12. A method of manufacture of an enclosure for electromagnetic shielding of electronic circuitry housed therein, comprising the steps of:

forming at least two parts which comprise the enclosure;

assembling together through mating surfaces, which are in electrical contact, said at least two parts, wherein said at least two parts are formed from a resin-impregnated fiber-reinforced composite containing at least in part electrically conductive fibers;

providing an inlet port having peripheral margins for a cable connector in at least one of said parts; and providing a ground path of metal on a surface of said at least one part for electrically connecting the mating surfaces with said peripheral margins of the inlet port.

13. The method as claimed in claim 12, wherein the step of providing the metal ground path comprises forming the metal ground from metal foil colaminated into the surface of said one part.

14. The method as claimed in claim 12, further comprising the step of forming a metal layer onto said mating surfaces.

15. The method as claimed in claim 14, wherein the step of forming the at least two parts uses a carbon fiber-reinforced epoxy resin composite.

* * * * *